United States Patent [19]

Schwab et al.

[11] Patent Number: 4,805,543
[45] Date of Patent: Feb. 21, 1989

[54] MICROPOSITIONING DEVICE

[75] Inventors: Philippe M. Schwab, Yverdon; Pierre M. Genequand, Geneva, both of Switzerland

[73] Assignee: Centre Suisse D'Electronique et de Microtechnique S.A., Neuchatel, Switzerland

[21] Appl. No.: 900,693

[22] Filed: Aug. 27, 1986

[30] Foreign Application Priority Data

Aug. 30, 1985 [FR] France .................. 85 12944

[51] Int. Cl.$^4$ .................................. G01B 5/00
[52] U.S. Cl. .............................. 108/20; 74/519
[58] Field of Search ............ 108/20, 21, 22, 136, 108/143; 74/581, 519, 16; 350/529, 531

[56] References Cited

U.S. PATENT DOCUMENTS

| | | | |
|---|---|---|---|
| 3,124,018 | 3/1964 | Gough | 108/20 |
| 4,012,111 | 3/1977 | Masterson | 350/529 |
| 4,312,126 | 1/1982 | Rochelt | 74/581 X |
| 4,559,717 | 12/1985 | Scire et al. | 350/531 X |
| 4,595,257 | 6/1986 | Fladien | 74/581 X |
| 4,649,762 | 3/1987 | Messinger et al. | 74/581 X |
| 4,688,908 | 8/1987 | Moore | 350/531 |

FOREIGN PATENT DOCUMENTS

| | | | |
|---|---|---|---|
| 682178 | 6/1966 | Belgium . | |
| 017144 | 4/1979 | European Pat. Off. . | |
| 149017 | 11/1984 | European Pat. Off. . | |
| 134268 | 3/1985 | European Pat. Off. . | |
| 2220807 | 3/1974 | Fed. Rep. of Germany . | |
| 2631751 | 2/1977 | Fed. Rep. of Germany | 74/519 |
| 624331 | 6/1949 | United Kingdom | 74/519 |

OTHER PUBLICATIONS

J. Phys. E: Sci. Instrum. vol. 17, 1984. Printed in Great Britain, Instrument Science and Technology, "Elastic Design of Fine Mechanism in Instruments", by P. H. Sydenham.

"Moving Stage Improves Accuracy of Microcircuit Measuring Technique"; by Russell D. Young, R. D. Young Consultants Inc., Apr. 1984.

Primary Examiner—Peter A. Aschenbrenner
Attorney, Agent, or Firm—Parkhurst, Oliff & Berridge

[57] ABSTRACT

A micropositioning device having a plurality of degrees of freedom is provided. This device is particularly useful in guiding optic components. The device has N degrees of freedom and comprises two rigid members, namely a reference base and a movable platform. The reference base and the movable platform are connected by N independent chains. Each chain consists of N elastic guide means with a single degree of freedom, arranged in series, and an actuator fixed to the reference base.

2 Claims, 6 Drawing Sheets

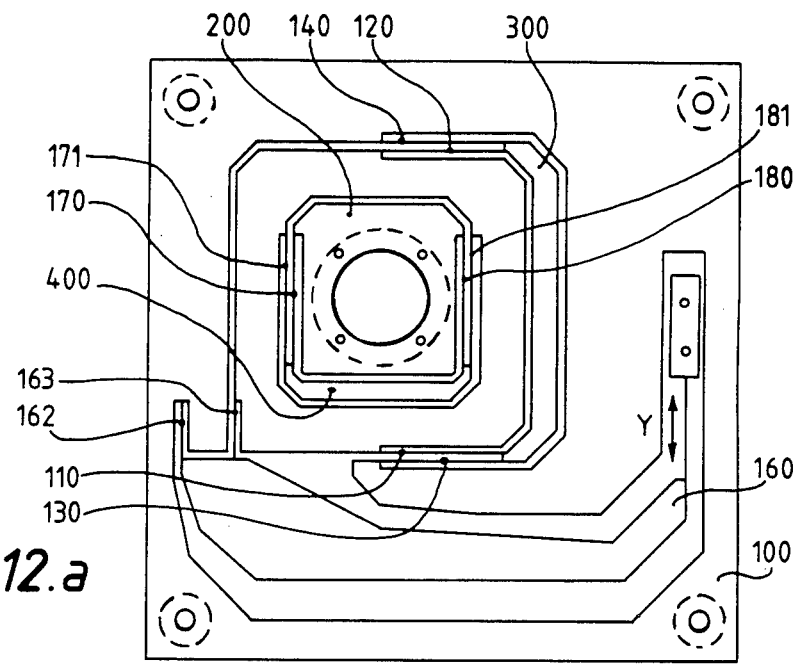
FIG.12.a
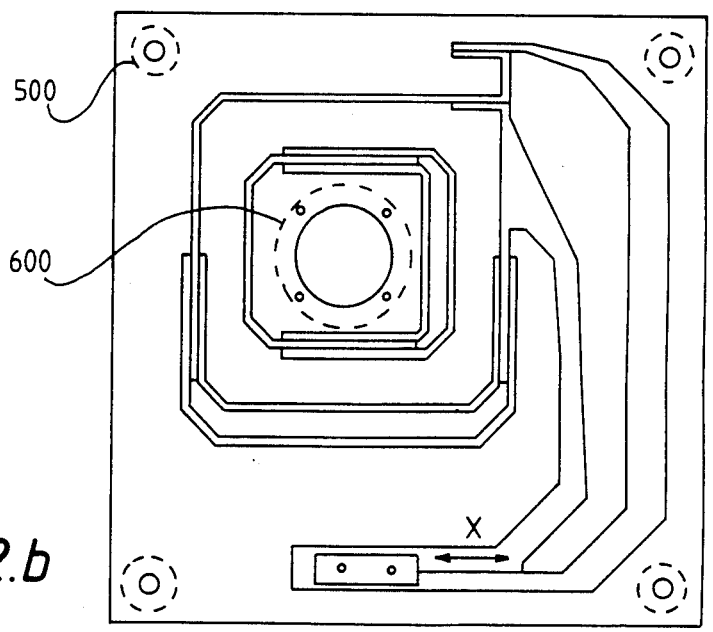
FIG.12.b

MICROPOSITIONING DEVICE

BACKGROUND OF THE INVENTION

The present invention relates to micropositioning devices in general and more particularly to micropositioning devices intended for aligning optical components.

Conventional translation devices with one degree of freedom comprise a mobile platform sliding on a base frame. The range of movement determined by this sliding, or kinematic, guide is controlled by an actuator, whose body is fixed to the base frame and whose mobile part is connected to the platform by an appropriate transmission means. When the movement of the actuator is approximately rectilinear and parallel to the translational axis of the guide, the transmission means is often no more than the platform being supported against the actuator through the intermediary of a ball. This support is ensured by a spring stretched between the frame and the platform.

The best known actuators are of two types: those with micrometer screws or those with piezoelectric disk stacks.

To achieve translation with two degrees of freedom, the frame of a second similar device is fixed to the mobile platform of a first device with one degree of freedom, the second device being orientated, however, in a different direction, for example at a right angle to the first device. FIG. 1 shows a conventional translation device with two degrees of freedom. Similarly, by fixing three one-dimensional modules in series a device with three degrees of freedom is obtained.

Conventional kinematic guiding devices allow the maintenance of a high degree of precision, typically between one and ten microns, for movements of relatively large range, in the order of 10 to 100 mm. Large movements are controlled by screw actuators. Sometimes a piezoelectric actuator is mounted in series with the screw, between the bearing ball and the mobile platform. This arrangement theoretically allows very great sensitivity, corresponding to a resolution lower than a 100th of a micron. However, such performances are illusory if they are not accompanied by corresponding stability and reproducibility on the part of the guide. The main limitations of kinematic systems are caused by the machining precision of the slideways, play, friction and wear.

In general, these devices remain ill-adapted to certain uses requiring a typical precision of a 10th of a micron as, for example, the positioning or mounting of monomode guided optics components.

In cases where displacement range is low, typically less than or equal to one mm., it has been proposed to utilize the principles of the elastic guide, as described for example in the article by P. H. Sydenham, entitled "Elastic Design of Fine Mechanism in Industry" and published in J. Phys. E. Sci. Instruments, Vol. 17 (1984) p. 922.

In this type of guide, use is made of the ease with which a thin and elongate strip, fixed at one end and acted upon at the other end, lends itself to deflection in a direction perpendicular to the strip, while remaining rigid in the parallel directions. This deflection of the strip is equivalent to a rotation of its free end around an axis situated in its plane when it is at rest. By an adequate combination of four such elastic "pivots", a translation according to the diagram of FIG. 7 can be obtained. This parallelogram configuration can be further improved so as to render the translation rectilinear, by means of a second parallelogram. This latter structure, shown in FIG. 8, can be used to effect translational guidance with a rectilinear coordinate.

When the deformations are calculated so as to remain well short of the elastic limits and the joints are cut in the body to prevent the effects of rigid fixing, a device is obtained without play, friction or wear, which is perfectly accurate and reproducible. Precision is limited only by the effect, combined with the finite rigidity of the strips in the directions perpendicular to the planned displacement, of a variable load applied in these directions.

A monolithic elastic system can be advantageously effected by the known method of machining by electro-erosion. A complex, monolithic, elastic guidance device, controlled by piezoelectric actuators, is reported by R. D. Young, in his article entitled "Moving Stage Improves Accuracy by Microcircuit Measuring Technique" published in Research & Development (April 1984), p. 114.

However, the implementation of micropositioning devices with elastic joints comes up against various problems connected with the integration of actuators into the system. Although piezoelectric actuators provide extremely high resolution, they have a number of disadvantages, including: the need for a control voltage which can reach values higher than 1,000 volts, non-linear response and the existence of high hysteresis. The use of such actuators necessitates the presence of a displacement detector incorporated in a control loop connected to each actuator.

Micrometer screw actuators have the advantage of large displacement but the disadvantage of being relatively heavy and bulky. With elastic guide systems, which are sensitive to the effects of load and vibrations, it is impossible to arrange in series several positioning modules with one degree of freedom in order to achieve displacement according to several coordinates if it is desired to take advantage of their properties and their high intrinsic precision.

SUMMARY OF THE INVENTION

It is therefore an object of the present invention to provide a micropositioning device which does not exhibit the limitations of the systems described above.

Another object of the invention is to provide a micropositioning device with several degrees of freedom allowing the mounting of monomode guide optics components.

Another object of the invention is the provision of a micropositioning device using elastic type guide means.

Another object of the invention is to provide a micropositioning device which is small and compact in structure.

Another object of the invention is to provide a micropositioning device which can be formed by electro-erosion.

A micropositioning device with N degrees of freedom ($2 \leq N \leq 6$) according to the present invention, comprises at least two rigid members connected by N guiding chains. The first member forms a reference base and the second member forms a mobile platform. The invention is further characterized in that each chain comprises N elastic means with a single degree of freedom connected in series between the reference base and the mobile platform and an actuator connected to the reference base and controlling the one guide means which is connected to said reference base.

BRIEF DESCRIPTION OF THE FIGURES

The above objects, features and advantages of the present invention will become more apparent from the description of the invention which follows, taken in conjunction with the accompanying drawings, wherein like reference numerals denote like elements, and wherein:

FIGS. 12a and 12b show a preferred embodiment of the invention using a micropositioner with two degrees of freedom.

DETAILED DESCRIPTION OF THE INVENTION

The present invention will be described in detail with reference to the accompanying drawings which illustrate preferred embodiments according to the present invention.

Figure 1:
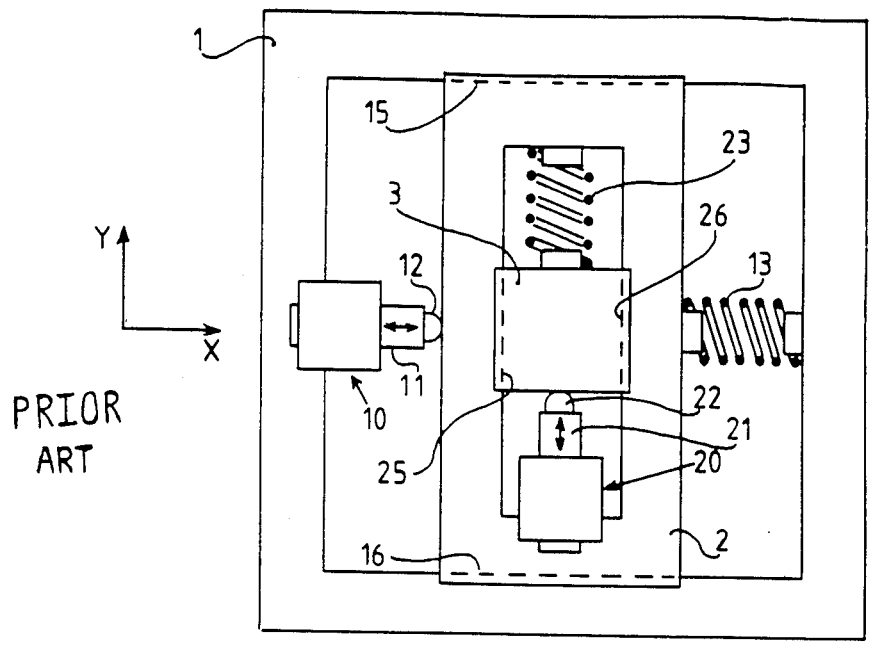
FIG. 1 is a diagram of a known positioning device with two degrees of freedom and a sliding guide.

A diagram of a known positioning device with two degrees of freedom is shown in FIG. 1. This device comprises a base frame 1 on which an intermediate platform 2 is slidably positioned. This intermediate platform 2 serves as base frame for the mobile platform 3. The actuator 10, secured to the frame 1, controls, through the intermediary of its mobile head 11 and its bearing ball 12, the movement of the platform 2 along a first coordinate. The actuator 20, secured to the intermediate platform 2, controls, through the intermediary of its mobile head 21 and its bearing ball 22, the movement of the mobile platform 3 along a second coordinate perpendicular to the first. Platform 2 is steadied by spring 13 and the mobile platform 3 is steadied by spring 23. The kinematic guidance of the two translational movements is ensured, respectively, by the bearing zones 15 and 16 for platform 2 and bearing zones 25 and 26 for mobile platform 3.

Figure 2:
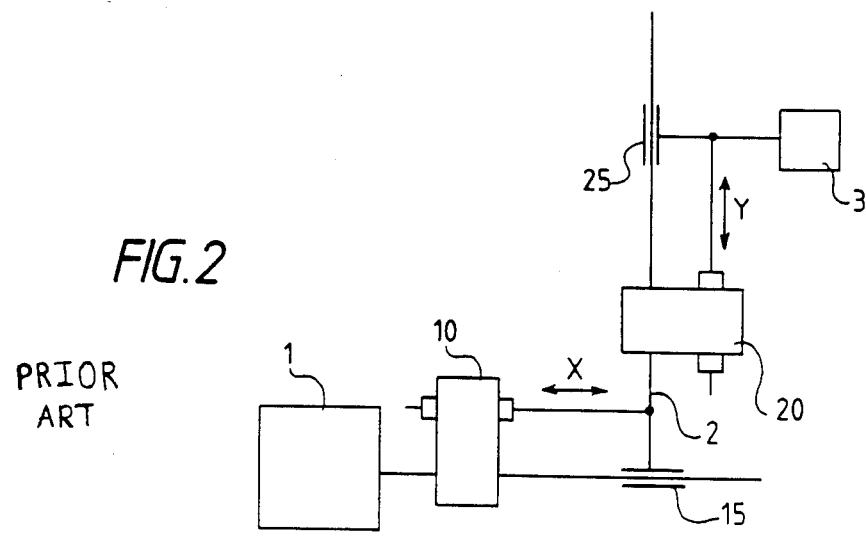
FIG. 2 is another representation of the device of FIG. 1, showing the connection in series of two displacement modules.

The device of FIG. 1 is shown diagrammatically in FIG. 2 so as to more explicitly show the series connection of the two displacement modules. It is apparent that, on the one hand, the two kinematic chains, in directions x and y, are dependent on each other, and, on the other hand, that if the actuator 10 is secured to the fixed reference platform 1, the actuator 20 is secured to a mobile part 2. The connection in series of the kinematic chains primarily results in the errors resulting from each chain being added to each other. Furthermore, the attachment of an actuator to a mobile part is disadvantageous when compact structures of low masses are required.

Figure 3:
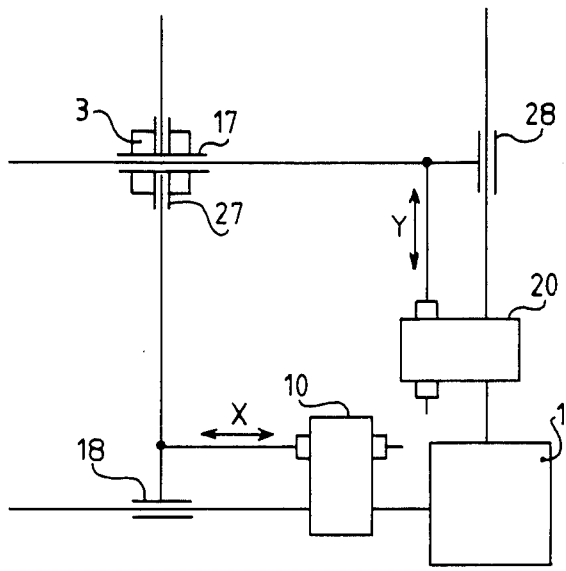
FIG. 3 is a diagram of a device with two degrees of freedom according to the principles of the present invention.

FIG. 3 shows an explanatory diagram of a device with two perpendicular translational movements in accordance with the principles of the present invention. The device comprises a reference platform 1, two actuators 10 and 20 for transmitting the translational movements along the x and y axes, respectively and a mobile platform 3. According to the invention, the two actuators are secured to the reference platform and the two kinematic chains are independent of each other. The first chain comprises the actuator 10, a first guide means 18 and a second guide means 27. The second chain comprises the actuator 20, a first guide means 28 and a second guide means 17. Each chain thus connects the reference platform 1 on the one hand and the mobile platform 3 on the other. An assembly of this type can be designated a connection in parallel, in contrast with the connection in series of FIG. 2. It should be noted that the guide means 17 and 27 also constitute means of isolating one chain from the other.

Figure 4:
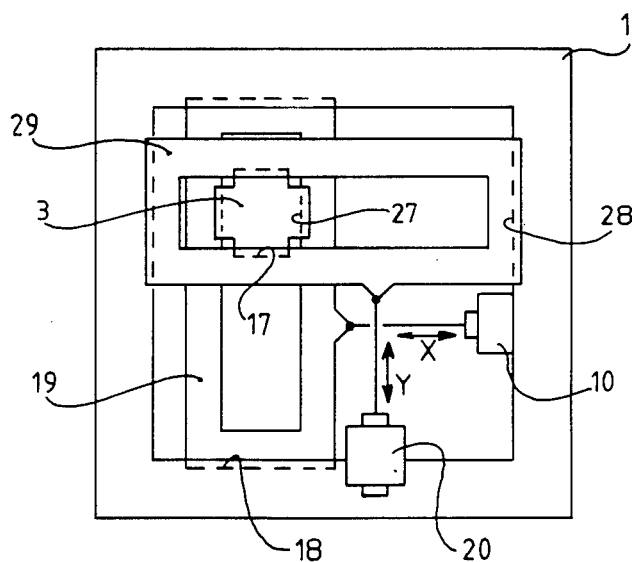
FIG. 4 shows an embodiment of the device of FIG. 3, using sliding guide means.

An embodiment of the structure diagramed in FIG. 3 is shown in FIG. 4. The reference platform 1 has pairs of perpendicular bearing surfaces (such as surfaces 18 and 28) serving as sliding guides for two intermediate platforms 19 and 29. These platforms are controlled by two actuators 10 and 20, secured to the reference platform 1. Intermediate platforms 19 and 29 also contain bearing surfaces in perpendicular pairs (such as surfaces 17 and 27). These surfaces serve as sliding guides for the mobile platform 3.

Figure 5:
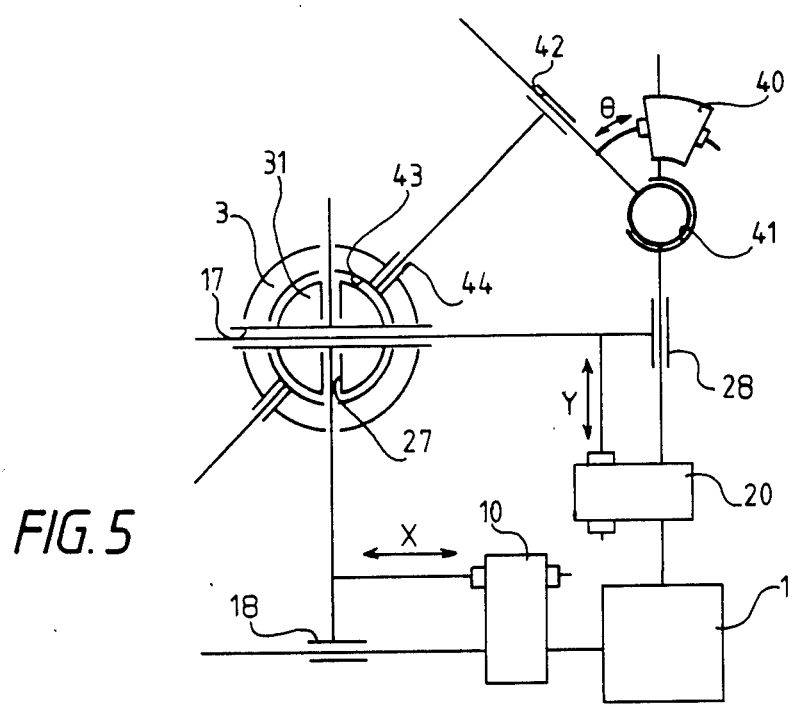
FIG. 5 is a diagram of a device with three degrees of freedom according to the present invention.

FIG. 5 shows another explanatory diagram of a device in accordance with the principles of the present invention. This device has three degrees of freedom corresponding to two translations and a rotation. The two x and y chains, described above, are included in this embodiment. These two chains allow the intermediate platform 31 to be displaced according to the two rectangular coordinates. The chain corresponding to the rotational movement comprises actuator 40, secured to reference platform 1, and guide means 41, 42 and 44.

Figure 6:
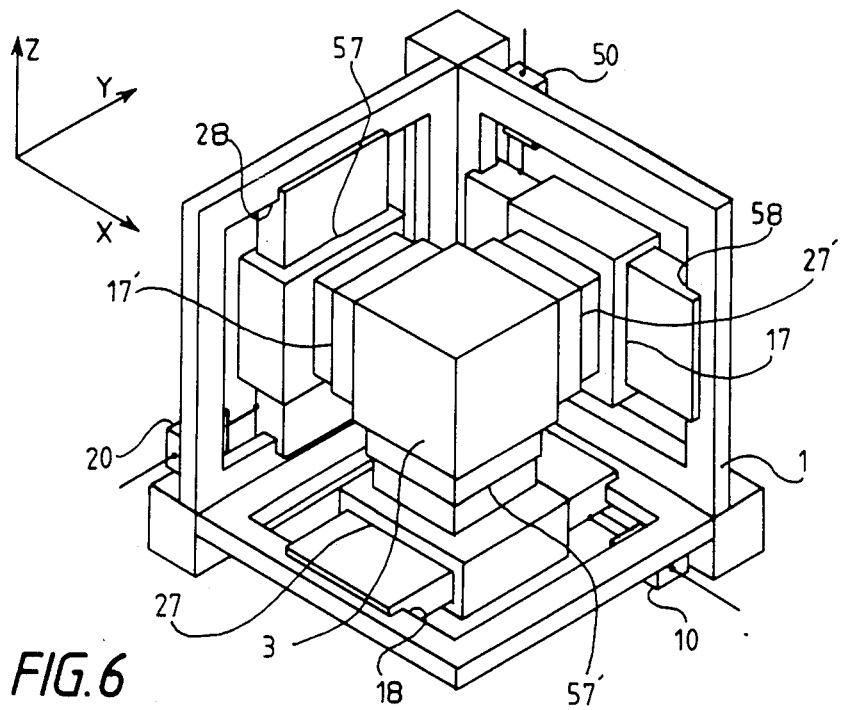
FIG. 6 shows an embodiment of a device with three degrees of freedom, using sliding guide means.

FIG. 6 shows an embodiment of a device with three degrees of freedom corresponding to three translations in three perpendicular directions designated x, y and z. The reference base 1 is in the shape of a trihedral rectangle each of the three faces of which have bearing areas 18, 28 and 58. The first kinematic chain comprises the actuator 10 and the guide means 18, 27 and 57'. The second chain comprises the actuator 20 and the guide means 28, 57 and 17'. The third chain comprises the actuator 50 and the guide means 58, 17 and 27'. The mobile platform 3 is thus driven translationally in three directions by three independent chains connected to the reference base 1.

Figure 7:
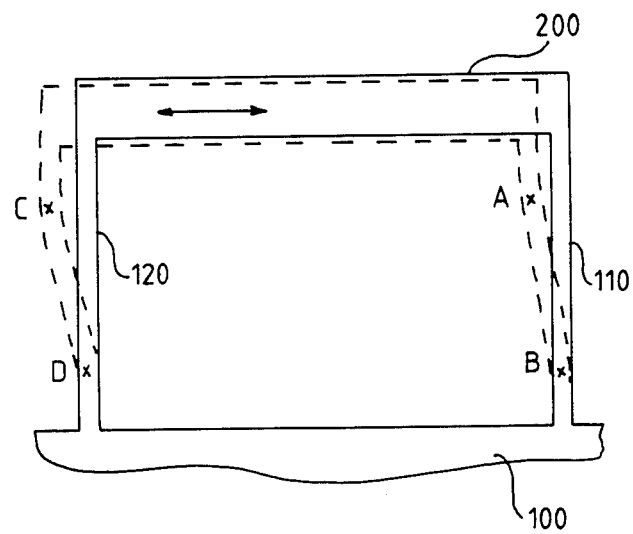
FIG. 7 shows a first embodiment of a translation device with an elastic guide.

Although the principles of the invention are, as has been seen in the previous embodiments, applicable to sliding guide means, the performance of the latter is restricted by the precision of machining of the slideways and the problems of play, friction and wear. The use of elastic guide means mitigates these disadvantages. FIG. 7 shows the principles of elastic guidance in the case of translational movement. The mobile platform 200 is attached to a reference base 100 by two thin, parallel, elastic strips 110 and 120. The mobile platform is capable of displacement in the direction of the arrow when it is subjected to a suitable force inducing the deflection of the elastic strips. It is possible to define two pivotal axes per strip, that is the axes designated A, B, C and D for strips 110 and 120. Because of the rotational movements around the abovedefined axes, the movement of the mobile platform 200 is not strictly rectilinear.

Figure 8:
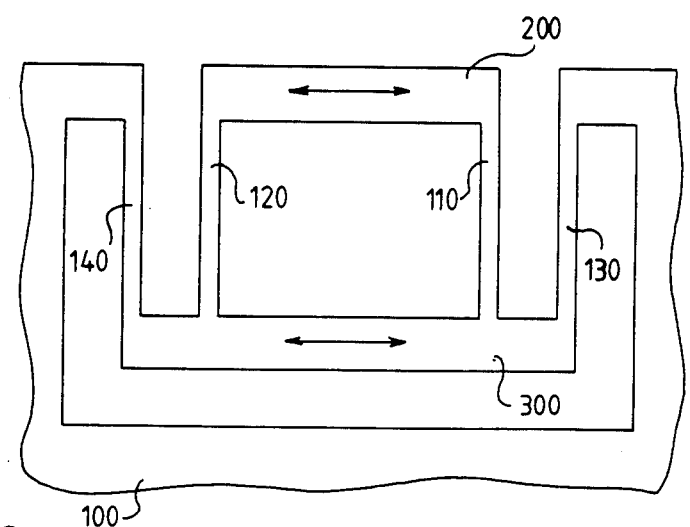
FIG. 8 shows a second embodiment of a translation device with an elastic guide.

FIG. 8 shows a device for translation by means of elastic guidance in which the errors of displacement due to rotation are compensated for. The device is in the form of a double parallelogram. The mobile platform 200 is attached, by two elastic strips 110 and 120, to an intermediate platform 300 which is attached to a reference base 100 by two elastic strips 130 and 140 parallel with the first two.

Figure 9:
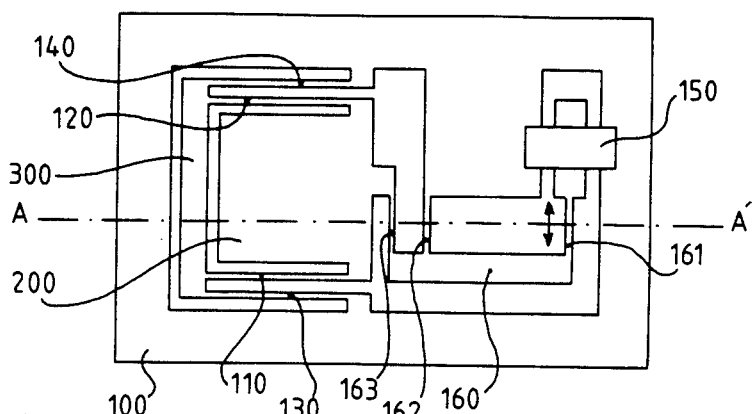
FIG. 9 shows a planar lay-out of a translation device incorporating a control means.
Figure 10:
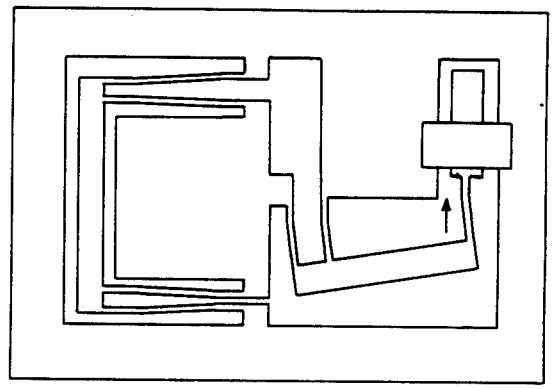
FIG. 10 shows the device of FIG. 9 after deformation.

FIG. 9 shows an embodiment of the above device incorporating control means. The double-parallelogram structure formed by the mobile platform 200, the intermediate platform 300, the elastic strips 110 to 140 and the reference base 100 can be distinguished. The mobile platform 200 is controlled by an actuator 150 fixed to the reference base, and a rigid transmission lever 160 connected to the actuator, the reference base and mobile platform by three elastic strips 161, 162 and 163 respectively. This arrangement for controlling the mobile platform allows reduction of the effect of a lack of precision at the level of the actuator (for example a micrometer screw) thanks to the reduction effected by the lever. The elastic strips 161 to 163 may be of unequal lengths but must have their centers aligned. Moreover, to ensure the linearity of the movement transmitted by the lever 160, the following condition must be fulfilled:

$$\frac{L3 - L2}{L1 - L2} = \frac{m}{n}$$

where $L_1$, $L_2$, $L_3$ are the lengths of strips 161, 162 and 163, respectively, m is the distance between the centers of the strips 163 and 162 and n is the distance between the centers of the strips 161 and 162. FIG. 10 shows the device of FIG. 9 in a displaced position.

An advantageous solution, from the perspective of both manufacturing costs and performance, is making these devices in monolithic form. For example, all of the elements of the chain can be cut into the same plate by electroerosion of a plate of aluminum.

Figure 11:
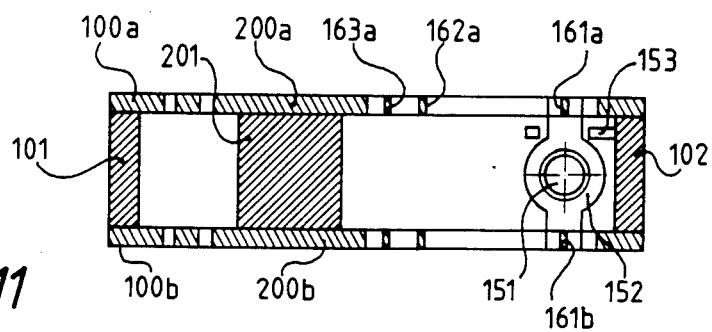
FIG. 11 is a cross-sectional view of a two-layer device.

FIG. 11 shows a cross-sectional view of an embodiment of a device with one degree of freedom in which, to increase the rigidity of the different pieces in directions other than that of the desired movement, two plates identical to that of FIG. 9 are arranged in parallel and are connected by braces. The cross-section, according to the line AA' of FIG. 9, shows an upper plate and a lower plate connected by three braces 101, 102 and 201. Braces 101 and 102 rigidly connect the two reference bases 100a and 100b, while the brace 201 rigidly connects the mobile platform 200a and 200b. FIG. 11 also shows the actuator, which consists of a micrometer screw 151 acting on a sliding nut 152 connected to the strips 161a and 161b.

This two-layer arrangement of the planar elastic structures is particularly suitable in translation devices with two degrees of freedom, for example in two perpendicular directions. FIG. 12 shows a preferred embodiment of two planar structures allowing two translational movements in two perpendicular directions. The two structures of FIGS. 12a and 12b are identical and designed to be arranged on top of each other so as to allow movement in the directions x and y. In each of the structures it is possible to distinguish the kinematic chain consisting of the transmission lever 160, the thin strips 162 and 163, the intermediate platform 300 and the elastic strips 110 to 140. Means of isolating the movements in directions x and y are also provided in the form of a second double parallelogram configuration. This second configuration, comprising a second intermediate platform 400 and the elastic strips 170, 171, 180 and 181, is perpendicular to the first and allows the isolation of the two kinematic chains. The mobile platform 200 is provided with a central hole so as to allow the mounting, for example, of optical components.

FIG. 12b shows the location of braces 500 connecting the reference bases of the four planar structures forming, as indicated above, a compact, two-layer assembly and the location of the central brace connecting the mobile platforms of the same four planar structures.

While the preferred embodiment of the present invention has been described, it is to be understood that the invention is not limited thereto, and may be otherwise embodied within the scope of the following claims.

What is claimed is:

1. A device for precisely positioning a mobile platform with respect to a reference base in at least two orthogonal directions, comprising:

at least one plate connected to an actuator for each of said orthogonal directions, each plate comprising a reference part rigidly fixed to said reference base, an intermediate platform, a mobile part, and a transmission lever connected to said actuator, connected to said reference part and connected to said intermediate platform, respectively, by means of a first set of three parallel elastic strips so as to transmit from the actuator to the intermediate platform a translational movement in a first direction and according to a given reduction ratio;

said intermediate platform being connected to said reference part by means of a second set of parallel elastic strips so that said intermediate platform moves in said first direction responsive to movement transmitted by the transmission lever; and said mobile part being rigidly fixed to said mobile platform and being coupled to said intermediate platform by means of a third set of parallel elastic strips, said third set of parallel elastic strips being disposed perpendicular to said second set of parallel elastic strips and being arranged whereby said mobile platform can be moved in a direction perpendicular to said first direction substantially without affecting movement of said mobile platform in said first direction.

2. A device according to claim 1, wherein respective reference parts and mobile parts of two plates corresponding to two of said at least two orthogonal directions are fastened rigidly together, whereby directions of translational movement transmitted by said two plates to the mobile platform are perpendicular to each other.

* * * * *